(12) United States Patent
Hammond, Jr. et al.

(10) Patent No.: US 7,787,615 B2
(45) Date of Patent: Aug. 31, 2010

(54) TELECOMMUNICATIONS JACK WITH CROSSTALK COMPENSATION AND ARRANGEMENTS FOR REDUCING RETURN LOSS

(75) Inventors: Bernard Harold Hammond, Jr., Aurora, CO (US); David Patrick Murray, Bishopston (GB); Ian Robert George, Churchdown (GB)

(73) Assignee: ADC Telecommunications, Inc., Eden Prairie, MN (US)

( * ) Notice: Subject to any disclaimer, the term of this patent is extended or adjusted under 35 U.S.C. 154(b) by 958 days.

(21) Appl. No.: 11/402,300

(22) Filed: Apr. 11, 2006

(65) Prior Publication Data
US 2007/0238366 A1 Oct. 11, 2007

(51) Int. Cl.
*H01R 24/00* (2006.01)
(52) U.S. Cl. .................. 379/417; 439/676; 439/941
(58) Field of Classification Search .............. 439/676, 439/941
See application file for complete search history.

(56) References Cited

U.S. PATENT DOCUMENTS

| | | | |
|---|---|---|---|
| 4,766,402 A * | 8/1988 | Crane ..................... 333/25 |
| 5,864,089 A | 1/1999 | Rainal |
| 5,997,358 A | 12/1999 | Adriaenssens et al. |
| 6,107,578 A | 8/2000 | Hashim |
| 6,120,330 A | 9/2000 | Gwiazdowski |
| 6,139,371 A | 10/2000 | Troutman et al. |
| 6,168,474 B1 | 1/2001 | German et al. |
| 6,231,397 B1 | 5/2001 | de la Borbolla et al. |
| 6,371,793 B1 | 4/2002 | Doorhy et al. |
| 6,428,362 B1 | 8/2002 | Phommachanh |
| 6,441,318 B1 | 8/2002 | Kiersh et al. |
| 6,443,777 B1 | 9/2002 | McCurdy et al. |
| 6,464,541 B1 | 10/2002 | Hashim et al. |
| 6,533,618 B1 | 3/2003 | Aekins |
| RE38,519 E | 5/2004 | Doorhy et al. |
| 6,736,681 B2 | 5/2004 | Arnett |
| 6,799,989 B2 | 10/2004 | Doorhy et al. |
| 6,830,488 B2 | 12/2004 | Bush et al. |
| 6,840,816 B2 | 1/2005 | Aekins |
| 6,866,548 B2 | 3/2005 | Hashim |
| 6,923,673 B2 | 8/2005 | Doorhy et al. |
| 7,052,328 B2 * | 5/2006 | Ciezak et al. ............... 439/676 |
| 7,186,149 B2 | 3/2007 | Hashim |
| 7,381,098 B2 | 6/2008 | Hammond, Jr. et al. |
| 2003/0119372 A1 | 6/2003 | Aekins |
| 2004/0067693 A1 | 4/2004 | Arnett |

(Continued)

OTHER PUBLICATIONS

International Search Report and Written Opinion mailed Jan. 14, 2009.

(Continued)

*Primary Examiner*—Walter F Briney, III
(74) *Attorney, Agent, or Firm*—Merchant & Gould P.C.

(57) ABSTRACT

The present disclosure relates to a telecommunications jack including a housing having a port for receiving a plug. The jack also includes a plurality of contact springs adapted to make electrical contact with the plug when the plug is inserted into the port of the housing, and a plurality of wire termination contacts for terminating wires to the jack. The jack further includes a circuit board that electrically connects the contact springs to the wire termination contacts. The circuit board includes a crosstalk compensation arrangement for reducing crosstalk at the jack. The circuit board also includes arrangements that reduce return loss at the jack.

18 Claims, 13 Drawing Sheets

U.S. PATENT DOCUMENTS

| | | | |
|---|---|---|---|
| 2004/0077222 | A1 | 4/2004 | AbuGhazaleh et al. |
| 2004/0082227 | A1* | 4/2004 | Hashim ..................... 439/676 |
| 2004/0184247 | A1 | 9/2004 | Adriaenssens et al. |
| 2005/0106946 | A1 | 5/2005 | Doorhy et al. |
| 2005/0250372 | A1 | 11/2005 | Doorhy et al. |
| 2005/0253662 | A1 | 11/2005 | Seefried |
| 2005/0254223 | A1* | 11/2005 | Hashim et al. .............. 361/793 |
| 2006/0014410 | A1 | 1/2006 | Caveney |
| 2007/0238367 | A1 | 10/2007 | Hammond, Jr. et al. |

OTHER PUBLICATIONS

U.S. Appl. No. 11/402,250, filed Apr. 11, 2006 entitled "Telecommunications Jack With Crosstalk Compensation Provided On A Multi-Layer Circuit Board," 36 pages.

U.S. Appl. No. 11/402,544, filed Apr. 11, 2006 entitled "Telecommunications Jack With Crosstalk Multi-Zone Crosstalk Compensation And Method For Designing," 37 pages.

* cited by examiner

TELECOMMUNICATIONS JACK WITH CROSSTALK COMPENSATION AND ARRANGEMENTS FOR REDUCING RETURN LOSS

TECHNICAL FIELD

The present invention relates generally to telecommunications equipment. More particularly, the present invention relates to telecommunications jacks that are configured to compensate for near end crosstalk.

BACKGROUND

In the field of data communications, communications networks typically utilize techniques designed to maintain or improve the integrity of signals being transmitted via the network ("transmission signals"). To protect signal integrity, the communications networks should, at a minimum, satisfy compliance standards that are established by standards committees, such as the Institute of Electrical and Electronics Engineers (IEEE). The compliance standards help network designers provide communications networks that achieve at least minimum levels of signal integrity as well as some standard of compatibility.

One prevalent type of communication system uses twisted pairs of wires to transmit signals. In twisted pair systems, information such as video, audio and data are transmitted in the form of balanced signals over a pair of wires. The transmitted signal is defined by the voltage difference between the wires.

Crosstalk can negatively affect signal integrity in twisted pair systems. Crosstalk is unbalanced noise caused by capacitive and/or inductive coupling between wires and a twisted pair system. The effects of crosstalk become more difficult to address with increased signal frequency ranges.

The effects of crosstalk also increase when transmission signals are positioned closer to one another. Consequently, communications networks include areas that are especially susceptible to crosstalk because of the proximity of the transmission signals. In particular, communications networks include connectors that bring transmission signals in close proximity to one another. For example, the contacts of traditional connectors (e.g., jacks and plugs) used to provide interconnections in twisted pair telecommunications systems are particularly susceptible to crosstalk interference.

FIG. 1 shows a prior art panel 20 adapted for use with a twisted pair telecommunications system. The panel 20 includes a plurality of jacks 22. Each jack 22 includes a port 24 adapted to receive a standard telecommunications plug 26. Each of the jacks 22 is adapted to be terminated to four twisted pairs of transmission wires. As shown at FIG. 2, each of the jacks 22 includes eight contact springs labeled as having positions 1-8. In use, contact springs 4 and 5 are connected to a first pair of wires, the contact springs 1 and 2 are connected to a second pair of wires, contact springs 3 and 6 are connected to a third pair of wires, and contact springs 7 and 8 are connected to a fourth pair of wires. As shown at FIG. 3, a typical plug 26 also has eight contacts (labeled 1-8) adapted to interconnect with the corresponding eight contacts of the jack 22 when the plug is inserted within the port 24.

To promote circuit density, the contacts of the jacks and the plugs are required to be positioned in fairly close proximity to one another. Thus, the contact regions of the jacks and plugs are particularly susceptible to crosstalk. Furthermore, certain pairs of contacts are more susceptible to crosstalk than others. For example, the first and third pairs of contacts in the plugs and jacks are typically most susceptible to crosstalk.

To address the problems of crosstalk, jacks have been designed with contact spring configurations adapted to reduce the capacitive coupling generated between the contact springs so that crosstalk is minimized. An alternative approach involves intentionally generating crosstalk having a magnitude and phase designed to compensate for or correct crosstalk caused at the plug or jack. Typically, crosstalk compensation can be provided by manipulating the positioning of the contacts or leads of the jack or can be provided on a circuit board used to electrically connect the contact springs of the jack to insulation displacement connectors of the jack.

The telecommunications industry is constantly striving toward larger signal frequency ranges. As transmission frequency ranges widen, crosstalk becomes more problematic. Thus, there is a need for further development relating to crosstalk remediation.

SUMMARY

One aspect of the present disclosure relates to circuit board layering configurations adapted for supporting the effective compensation of crosstalk in a telecommunications jack.

Another aspect of the present disclosure relates to the use of high impedance lines to compensate for return loss caused by crosstalk compensation arrangements.

Still another aspect of the present disclosure relates to the use of capacitive couplings to overcome return loss issues caused by crosstalk compensation arrangements.

Still another aspect of the present disclosure relates to crosstalk compensation arrangements and methods for designing crosstalk compensation arrangements.

A variety of additional inventive aspects will be set forth in the description that follows. The inventive aspects can relate to individual features and to combinations of features. It is to be understood that both the foregoing general description and the following detailed description are exemplary and explanatory only and are not restrictive of the broad inventive concepts upon which the embodiments disclosed herein are based.

DETAILED DESCRIPTION

Figure 1:
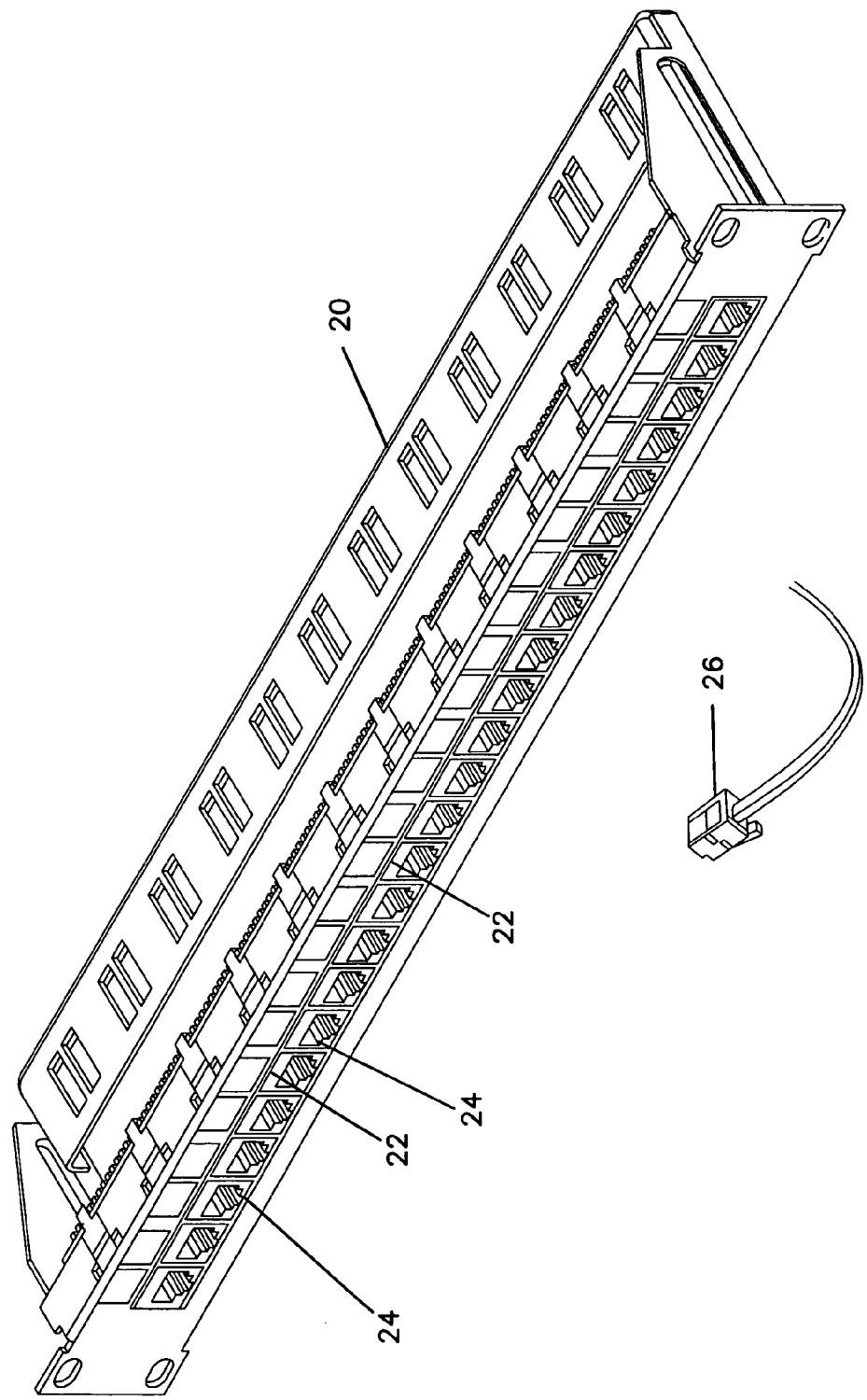
FIG. 1 is a perspective view of a prior art telecommunications panel.
Figure 2:
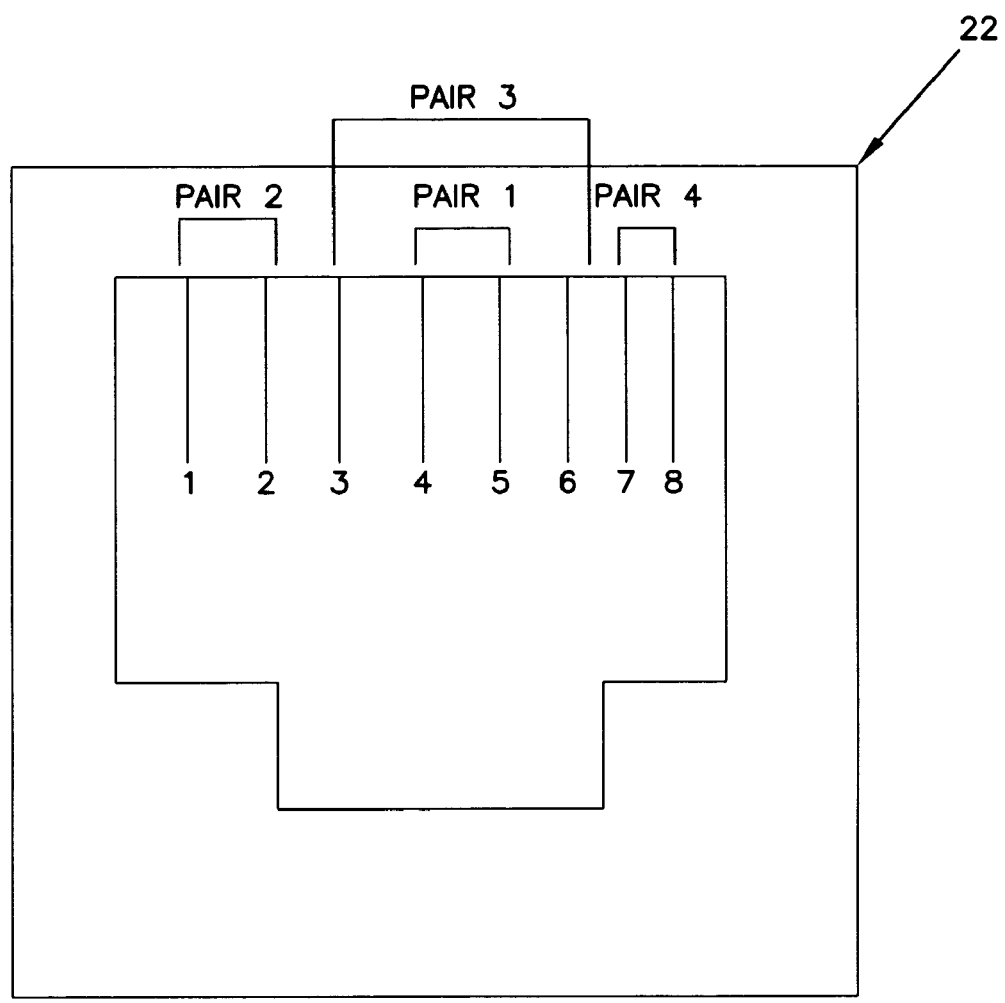
FIG. 2 is a schematic illustration of a prior art jack.
Figure 3:
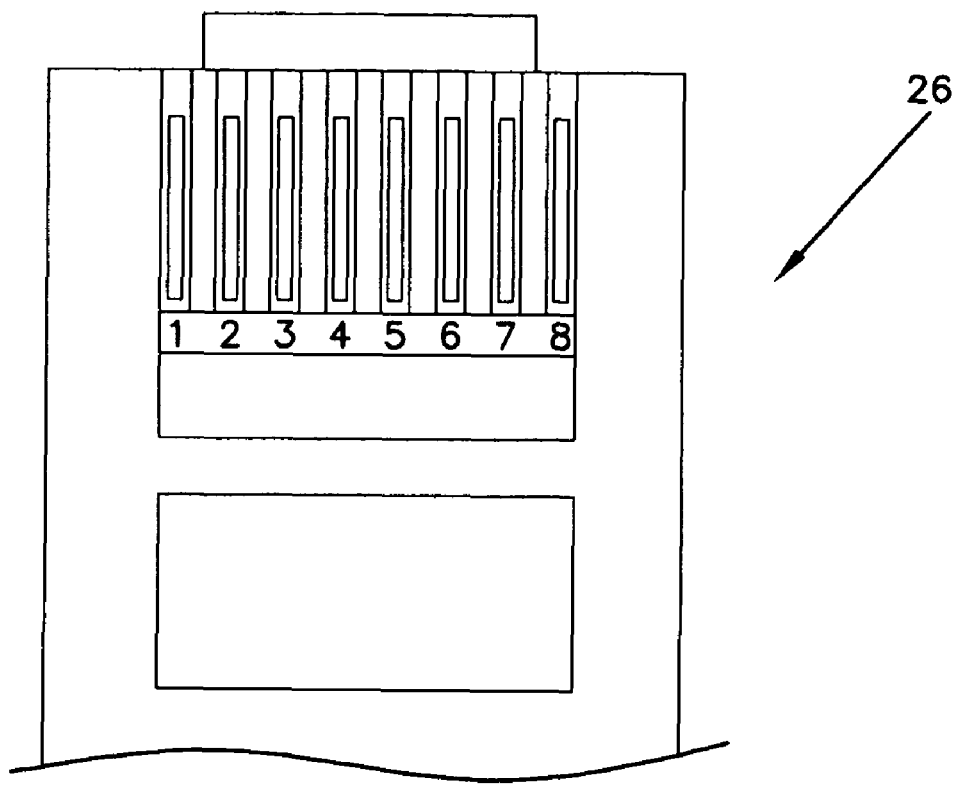
FIG. 3 is a schematic representation of a prior art telecommunications plug.
Figure 4:
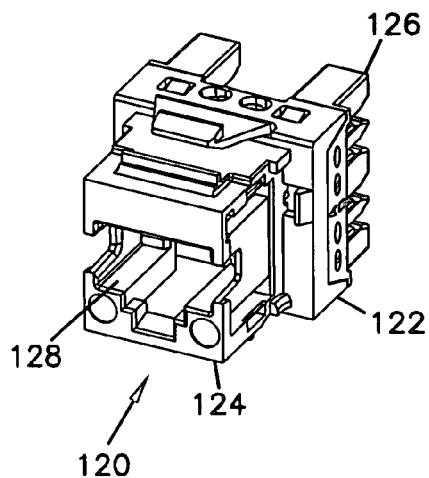
FIG. 4 is a front, perspective view of a telecommunications jack having features that are examples of inventive aspects in accordance with the principles of the present disclosure.
Figure 5:
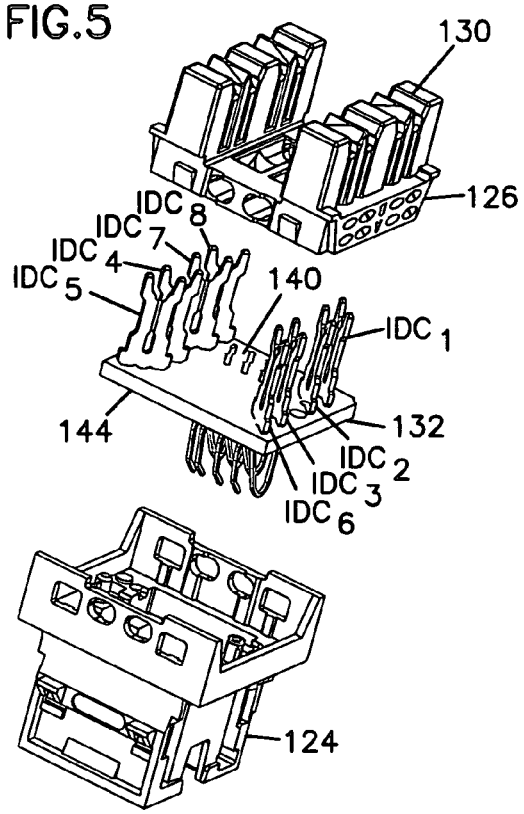
FIG. 5 is an exploded view of the jack of FIG. 4.

FIGS. 4 and 5 show a telecommunications jack 120 (i.e., a telecommunications connector) having features that are examples of inventive aspects in accordance with the principles of the present disclosure. The jack 120 includes a dielectric housing 122 having a front piece 124 and a rear piece 126. The front and rear pieces 124, 126 can be interconnected by a snap fit connection. The front piece 124 defines a front port 128 sized and shaped to receive a conventional telecommunications plug (e.g., an RJ style plug such as an RJ 45 plug). The rear piece 126 defines an insulation displacement connector interface and includes a plurality of towers 130 adapted to house insulation displacement connector blades/contacts. The jack 120 further includes a circuit board 132 that mounts between the front and rear pieces 124, 126 of the housing 122. A plurality of contact springs $CS_1$-$CS_8$ are terminated to a front side of the circuit board 132. A plurality of insulation displacement connector blades $IDC_1$-$IDC_8$ are terminated to a back side of the circuit board 132. The contact springs $CS_1$-$CS_8$ extend into the front port 128 and are adapted to be electrically connected to corresponding contacts provided on a plug when the plug is inserted into the front port 128. The insulation displacement connector blades $IDC_1$-$IDC_8$ fit within the towers 130 of the rear piece 126 of the housing 122. The circuit board 132 has tracks $T_1$-$T_8$ (e.g., tracings, see FIGS. 14-17) that respectively electrically connect the contact springs $CS_1$-$CS_8$ to the insulation displacement connector blades $IDC_1$-$IDC_8$.

In use, wires are electrically connected to the contact springs $CS_1$-$CS_8$ by inserting the wires between pairs of the insulation displacement connector blades $IDC_1$-$IDC_8$. When the wires are inserted between pairs of the insulation displacement connector blades $IDC_1$-$IDC_8$, the blades cut through the insulation of the wires and make electrical contact with the center conductors of the wires. In this way, the insulation displacement connector blades $IDC_1$-$IDC_8$, which are electrically connected to the contact springs $CS_1$-$CS_8$ by the tracks on the circuit board, provide an efficient means for electrically connecting a twisted pair of wires to the contact springs $CS_1$-$CS_8$ of the jack 120.

Figure 6:
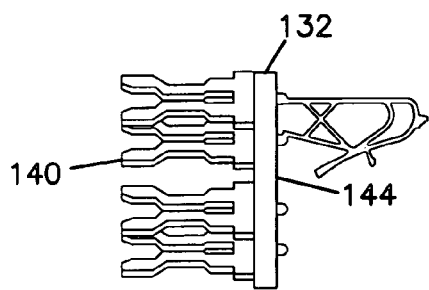
FIG. 6 is a side view of the circuit board, insulation displacement connectors and contact springs of the telecommunications jack of FIG. 4.
Figure 7:
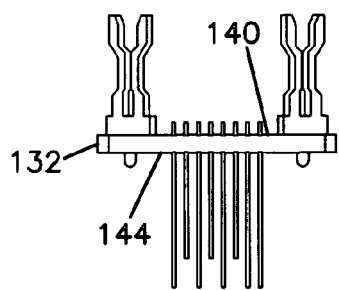
FIG. 7 is a front view of the circuit board, contact springs and insulation displacement connectors of FIG. 6.
Figure 8:
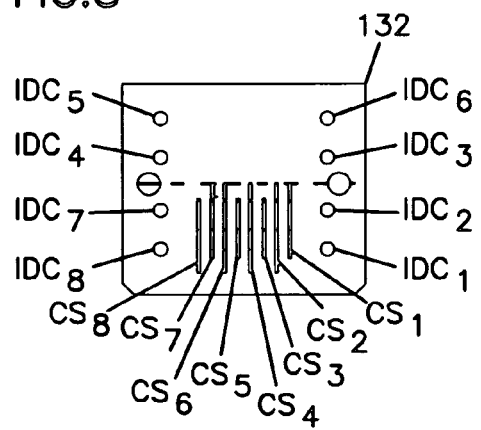
FIG. 8 is a top view of the circuit board and contact springs of FIG. 6.

The contact springs $CS_1$-$CS_8$ are shown more clearly in FIGS. 6-8. The relative positioning, shape and curvature of the contact springs $CS_1$-$CS_8$ is preferably adapted to provide some initial crosstalk compensation at the jack 120.

Figure 9:
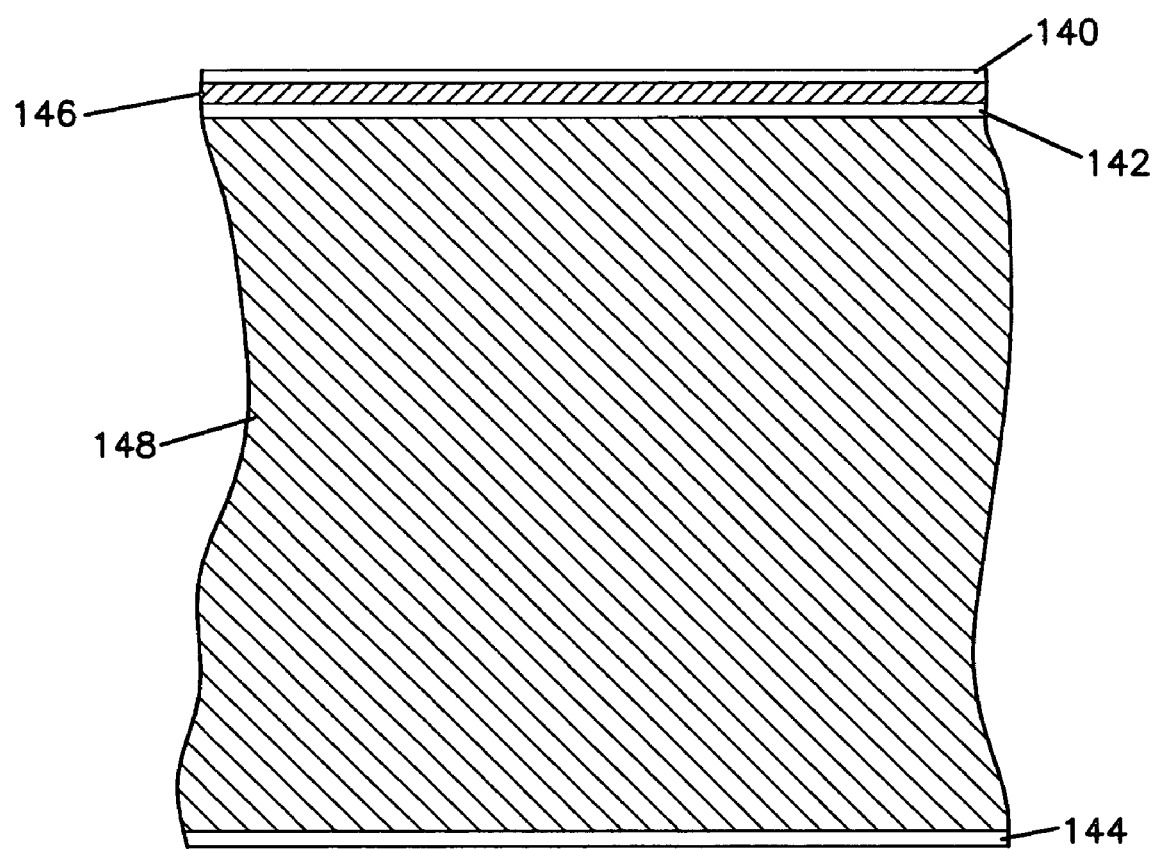
FIG. 9 is a cross-sectional view taken along section line 9-9 of FIG. 8.

The circuit board 132 of the jack 120 is preferably a multiple layer circuit board. For example, FIG. 9 shows the circuit board 132 including a first conductive layer 140, a second conductive layer 142 and a third conductive layer 144. The first and second conductive layers 140, 142 are separated by a first dielectric layer 146. The second and third conductive layers 142, 144 are separated by a second dielectric layer 148. The first conductive layer 140 is located at a front side of the circuit board 132 and the third conductive layer 144 is located at a back side of the circuit board 132. The contact springs $CS_1$-$CS_8$ are mounted at the front side of the circuit board 132, while the insulation displacement connector blades $IDC_1$-$IDC_8$ are mounted at the back side of the circuit board 132. Vias extend through the first and second dielectric layers 146, 148 to provide electrical connections between the conductive layers 140, 142 and 144. The conductive layers 140, 142 and 144 are defined by electrically the conductive tracks $T_1$-$T_8$ (see FIGS. 14-17). The tracks $T_1$-$T_8$ are formed (e.g., etched or otherwise provided) on the dielectric layers 146, 148.

The circuit board 132 preferably includes structures for compensating for near end crosstalk that occurs at the jack/plug interface. In certain embodiments, the structures for compensating for near end crosstalk include capacitive couplings provided between the first and second conductive layers 140, 142. In preferred embodiments, the capacitive couplings are provided by sets of opposing, generally parallel capacitive plates located at the first and second conductive layers 140, 142. To increase the magnitude of the capacitive coupling provided between the capacitive plates of the first and second conductive layers 140, 142, it is desirable for the first dielectric layer 146 to be relatively thin. For example, in certain embodiments the first dielectric layer 146 can have a thickness $t_1$ less than about 0.01 inches, or less than about 0.0075 inches, or less than about 0.005 inches, or less than 0.003 inches. In other embodiments, the thickness $t_1$ can be in the range of 0.001 inches to 0.003 inches or in the range of 0.001 inches to 0.005 inches. In a preferred embodiment, the thickness $t_1$ is about 0.002 inches.

In certain embodiments, the first dielectric layer 146 can be made of a material having a relatively low dielectric constant. As used herein, dielectric constants are dielectric constants relative to air. In certain embodiments, the dielectric constant of the first dielectric layer 146 can be equal to or less than about 5. In other embodiments, the dielectric constant of the first dielectric layer 146 can be less than or equal to about 4 or less than or equal to about 3. An example material for manufacturing the first dielectric layer 146 is a flame resistant 4 (FR-4) circuit board material. FR-4 circuit board material is a composite of a resin epoxy reinforced with a woven fiberglass mat.

The second dielectric layer 148 is preferably configured to isolate the third conductive layer 144 from the first and second conductive layers 140, 142. The second dielectric layer 148 can have a different thickness $t_2$ than the thickness $t_1$ of the first dielectric layer 146. In certain embodiments, the second dielectric layer 148 is at least 2.5 times thicker than the first dielectric layer 146 or at least five times thicker than the first dielectric layer 146. In still other embodiments, the second dielectric layer 148 is at least 10 times or at least 20 times thicker than the first dielectric layer 146. In one example embodiment, the thickness $t_2$ of the second dielectric layer 148 is in the range of 0.050 inches to 0.055 inches. In another example embodiment, the thickness $t_2$ of the second dielectric layer 148 is in the range of 0.040 inches to 0.050 inches.

The second dielectric layer 148 can also be manufactured of a different material as compared to the first dielectric layer 146. In certain embodiments, the second dielectric layer can have different dielectric properties as compared to the first dielectric layer 146. For example, in certain embodiments the first dielectric layer 146 can have a dielectric constant that is greater (e.g., at least 1.5 times or at least 2 times greater) than the dielectric constant of the second dielectric layer 148. In one example, the second dielectric layer 148 can be manufactured of a material such as FR-4. Of course, it will be appreciated that other materials could also be used.

Figure 10:
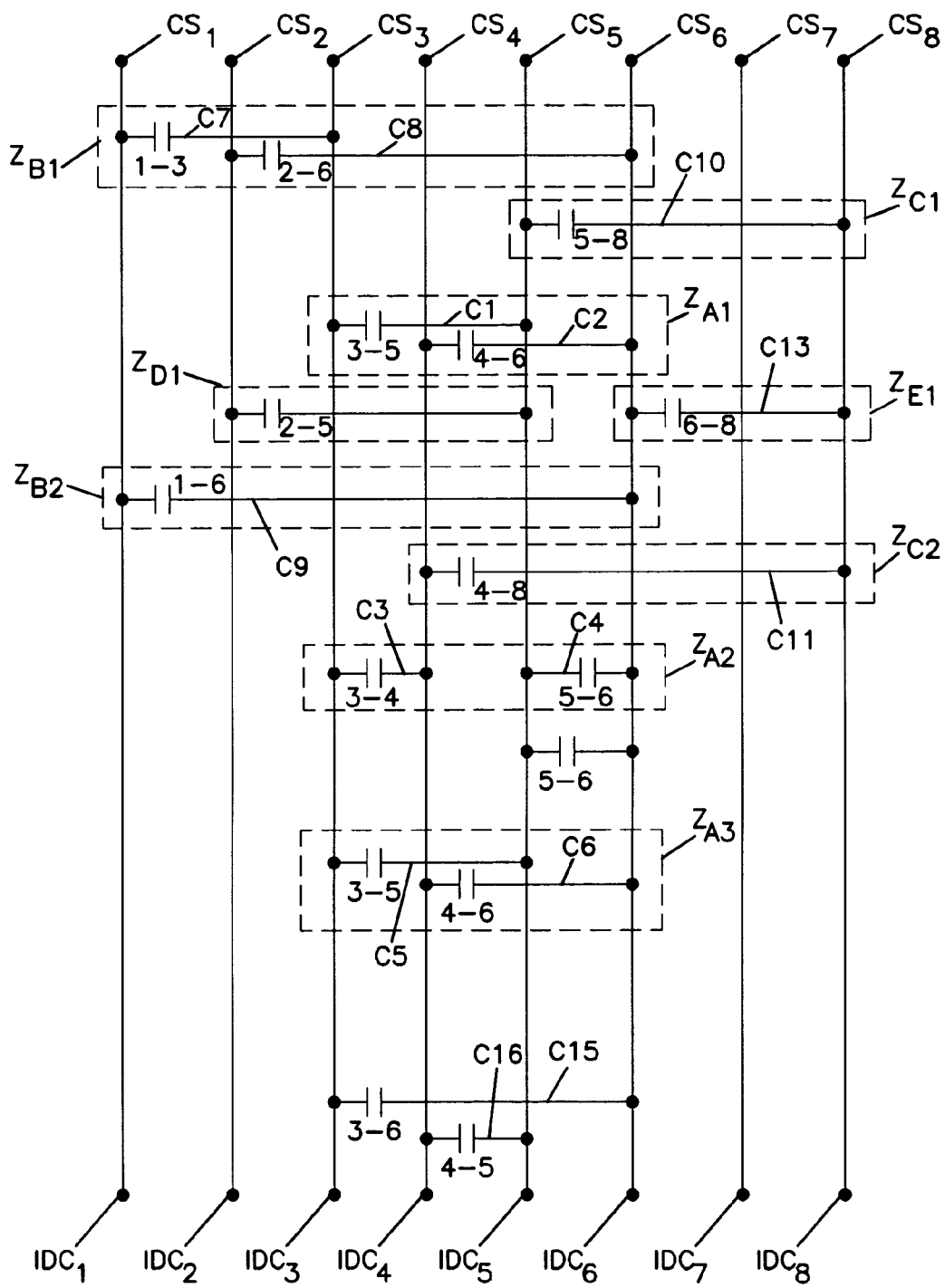
FIG. 10 is a schematic diagram showing a crosstalk compensation scheme incorporated into the telecommunications jack of FIG. 4.

The circuit board 132 includes a number of capacitive couplings having magnitudes and locations adapted to compensate for near end crosstalk. Near end crosstalk is most problematic between the 4-5 and 3-6 pairs. To compensate for near end crosstalk between the 4-5 and 3-6 pairs, three interdependent zones of compensation are used between tracks $T_{4-5}$ and tracks $T_{3-6}$. As shown at FIG. 10, the three interdependent zones of compensation include a first zone of compensation $Z_{A1}$, a second zone of compensation $Z_{A2}$ and a third zone of compensation $Z_{A3}$. The first zone of compensation $Z_{A1}$ includes a capacitive coupling C1 between track $T_3$ and track $T_5$, and a capacitive coupling C2 between track $T_4$ and track $T_6$. The second zone of compensation $Z_{A2}$ includes a capacitive coupling C3 between track $T_3$ and track $T_4$, and a capacitive coupling C4 between track $T_5$ and track $T_6$. The third zone of compensation $Z_{A3}$ includes a capacitive coupling C5 between track $T_3$ and track $T_5$, and a capacitive coupling C6 between track $T_4$ and track $T_6$.

Figure 11:
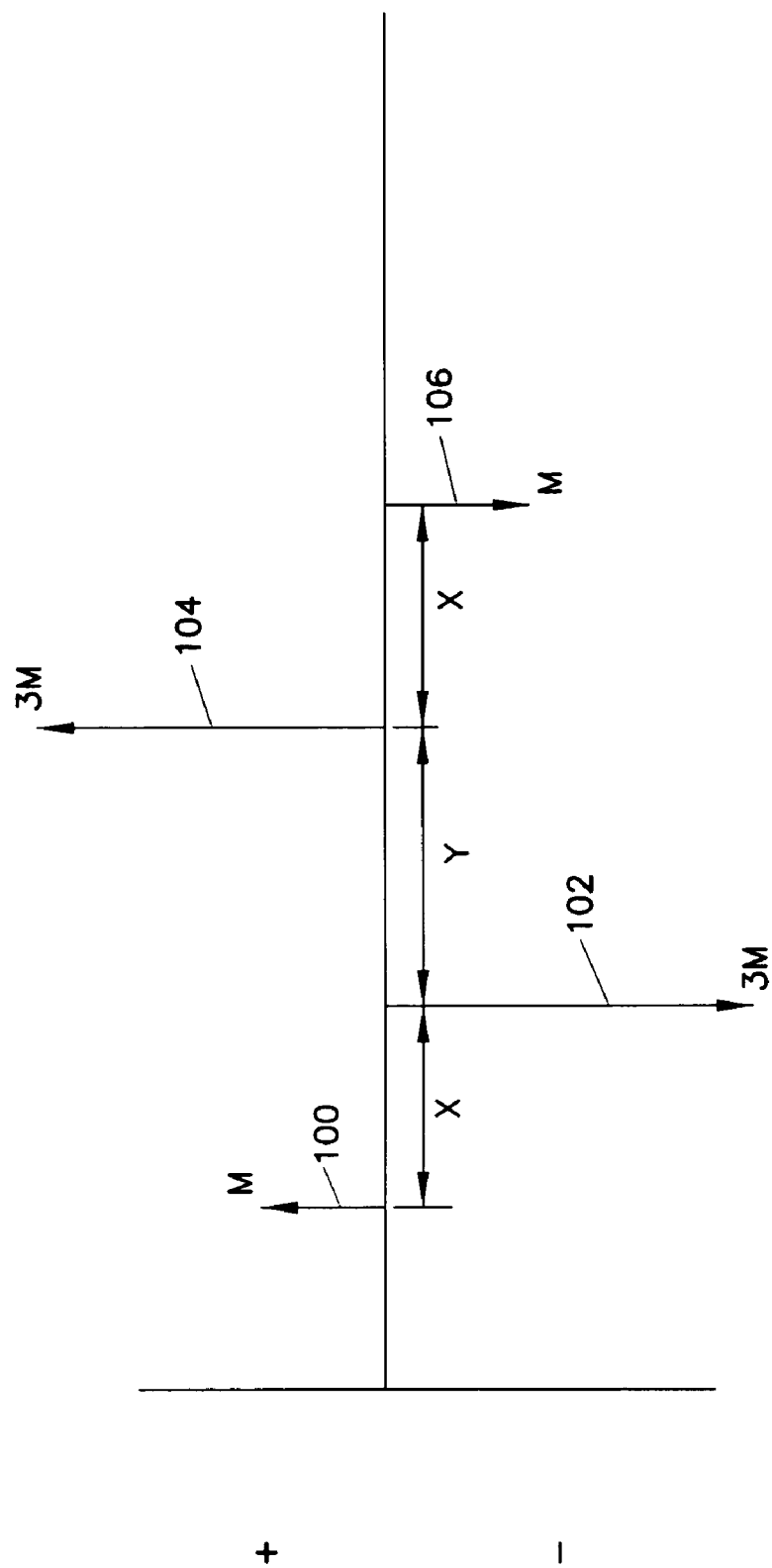
FIG. 11 is a schematic diagram showing a compensation arrangement used to provide crosstalk compensation between the 4-5 and 3-6 pairs of the telecommunications jack of FIG. 4.

FIG. 11 is a schematic diagram representative of the compensation arrangement used to provide crosstalk compensation between the 4-5 and 3-6 pairs. As shown at FIG. 11, the compensation arrangement includes a first vector 100, a second vector 102, a third vector 104, and a fourth vector 106. The first vector 100 and the third vector 104 have positive polarities, while the second vector 102 and the fourth vector 106 have negative polarities. The first vector 100 has a magnitude of M and corresponds to crosstalk introduced at the plug. The second vector 102 has a magnitude of −3M and corresponds to crosstalk introduced at the first zone of compensation $Z_{A1}$. The third vector 104 has a magnitude of 3M and corresponds to crosstalk introduced at the second zone of compensation $Z_{A2}$. The fourth vector 106 has a magnitude of −M and corresponds to crosstalk introduced at the third zone of compensation $Z_{A3}$. It will be appreciated that each vector is a lump sum of the total crosstalk provided at each respective compensation zone, with the vectors being placed at the centers or midpoints of the compensation zones.

In designing the compensation scheme of FIG. 11, a number of factors are taken into consideration when determining the placement of the compensation zones. One factor includes the need to accommodate signal travel in both directions (i.e., in forward and reverse directions) through the tracks on the circuit board. To accommodate forward and reverse transmissions through the circuit board, the compensation scheme preferably has a configuration with forward and reverse symmetry. It is also desirable for the compensation scheme to provide optimized compensation over a relatively wide range of transmission frequencies. For example, in one embodiment, performance is optimized for frequencies ranging from 1 MHz to 500 MHz. It is further desirable for the compensation arrangement to take into consideration the phase shifts that occur as a result of the time delays that take place as signals travel between the zones of compensation.

To minimize the effect of phase shift in the compensation arrangement, it is preferred for the second vector 102 to be positioned as close as possible to the first vector 100. In FIG. 11, the time delay between the first vector 100 and the second vector 102 is shown as x. In one example embodiment, x can be about 100 picoseconds for a signal having a transmission speed of $3 \times 10^8$ meters per second.

To maintain forward and reverse symmetry, it is preferred for the time delay between the third vector 104 and the fourth vector 106 to be approximately the same as the time delay between the first vector 100 and the second vector 102. As shown in FIG. 11, the time delay between the third and fourth vectors is depicted as x.

The time delay y between the second vector 102 and the third vector 104 is preferably selected to optimize the overall compensation effect of the compensation scheme over a relatively wide range of frequencies. By varying the time delay y between the second vector 102 and the third vector 104, the phase angles of the first and second compensation zones are varied thereby altering the amount of compensation provided at different frequencies. In one example embodiment, to design the time delay y, the time delay y is initially set with a value generally equal to x (i.e., the time delay between the first vector 102 and the second vector 104). The system is then tested or simulated to determine if an acceptable level of compensation is provided across the entire signal frequency range intended to be used. If the system meets the crosstalk requirements with the value y set equal to x, then no further adjustment of the value y is needed. If the compensation scheme fails the crosstalk requirements at higher frequencies, the time delay y can be shortened to improve performance at higher frequencies. If the compensation scheme fails the crosstalk requirements at lower frequencies, the time delay y can be increased to improve crosstalk performance for lower frequencies. It will be appreciated that the time delay y can be varied without altering forward and reverse symmetry.

It has been determined that when magnitudes of the second and third vectors 102, 104 are respectively −3M and 3M, the distance y is preferably greater than the distance x to provide optimized crosstalk compensation. However, if the magnitudes of the vectors 102, 104 are reduced below −3M and 3M (e.g., to −2.7M and 2.7M), the distance y is preferably less than the distance x to provide optimized crosstalk compensation.

Figure 12:
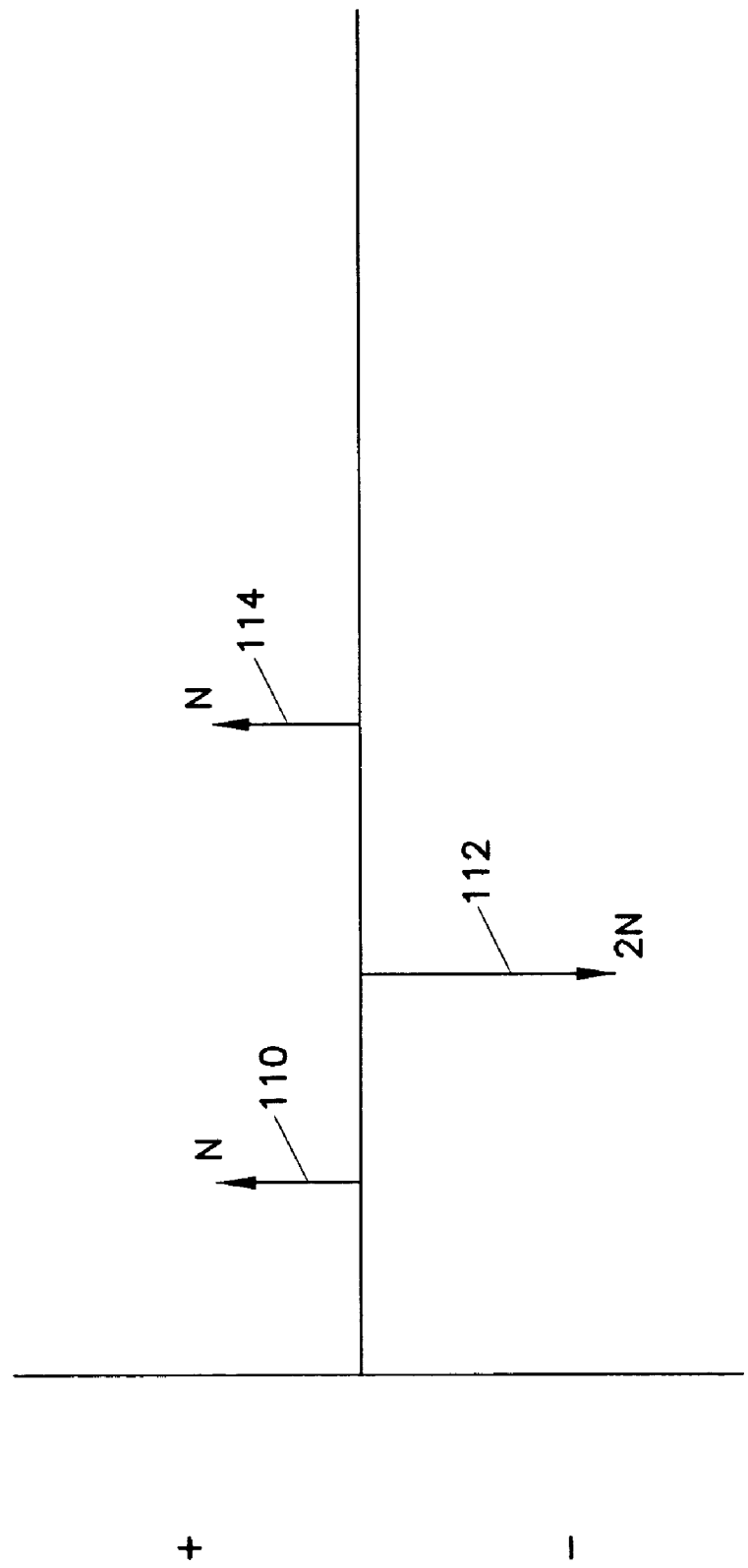
FIG. 12 is a schematic vector diagram showing a compensation arrangement used to provide crosstalk compensation between the 1-2 and 3-6 pairs of the telecommunications jack of FIG. 4.

Crosstalk can also be an issue between the 1-2 and 3-6 pairs. Particularly, substantial crosstalk can be generated between track $T_2$ and track $T_3$. As shown at FIG. 10, a two-zone compensation arrangement is used to compensate for this crosstalk. The two-zone compensation arrangement includes a first zone of compensation $Z_{B1}$ and a second zone of compensation $Z_{B2}$. The first zone of compensation $Z_{B1}$ includes a capacitive coupling C7 between track $T_1$ and track $T_3$, and a capacitive coupling C8 between track $T_2$ and track $T_6$. The second zone of compensation $Z_{B2}$ includes a capacitive coupling C9 between track $T_1$ and track $T_6$. FIG. 12 is a schematic vector diagram showing the compensation arrangement used between the 1-2 and 3-6 pairs. As shown at FIG. 12, three crosstalk vectors are taken into consideration. The first crosstalk vector 110 is representative of crosstalk generated at the plug. A second vector 112 is representative of crosstalk provided at the first compensation zone $Z_{B1}$. The third vector 114 is representative of crosstalk generated at the second compensation zone $Z_{B2}$. The first and third vectors 110, 114 have positive polarities and magnitudes of about N. The second vector 112 has a negative polarity and a vector about 2N. In testing the compensation arrangement provided between tracks 1-2 and 3-6, it was determined that improved results were obtained when no discrete capacitive coupling was provided between the track $T_2$ and track $T_3$ at the second zone of compensation $Z_{B2}$. However, in alternative embodiments, a discrete capacitive coupling can also be provided between track $T_2$ and track $T_3$ to maintain symmetry. It will be appreciated that M (shown at FIG. 11) is typically substantially greater in magnitude than N (shown at FIG. 12).

A two-zone compensation arrangement can be also be used to provide crosstalk compensation between the 4-5 and 7-8 pairs. For example, FIG. 10 depicts a first zone of compensation $Z_{C1}$ and a second zone of compensation $Z_{C2}$ providing compensation between the 4-5 and 7-8 pairs. The first zone of compensation $Z_{C1}$ includes a capacitive coupling C10 between track $T_8$ and track $T_5$. The second zone of compensation $Z_{C2}$ includes a capacitive coupling C11 between tracks 8 and 4. The first and second zones of compensation $Z_{C1}$ and $Z_{C2}$ can have a 1-2-1 magnitude sequence similar to the two-zone compensation arrangement described with respect to tracks 1-2 and 3-6.

In addition to the multiple zone compensation arrangements described above, a number of single zone compensations can also be used. For example, zone $Z_{D1}$ is a single zone compensation including a capacitive coupling C12 provided between track $T_2$ and track $T_5$. Another single zone compensation $Z_{E1}$ is provided by a capacitive coupling C13 formed between track $T_6$ and track $T_8$. Another capacitive coupling C14 between track $T_5$ and track $T_6$ compensates for unintended crosstalk generated within the board itself.

To address the crosstalk issue between the 4-5 and 3-6 pairs, a relatively large amount of capacitance is used. This large amount of capacitance can cause the jack to have unacceptable levels of return loss. A number of methods can be used to improve return loss performance. For example, return loss performance can be improved by increasing the impedance of tracks $T_3$, $T_4$, $T_5$ and $T_6$ of the board. The impedance of the tracks is preferably increased through the first, second and third zones of compensation, and also after the first, second, and third zones of compensation. The impedance can be increased by minimizing the transverse cross sectional area of tracks $T_3$, $T_4$, $T_5$ and $T_6$. An example transverse cross-sectional area of the tracks is in the range of 13 to 16 square mils (1 mil=0.001 inches). The impedance can also increase by routing the tracks so as to maintain a relatively large spacing between tracks $T_3$ and $T_4$ and between tracks $T_5$ and $T_6$. In one embodiment, the impedance of the tracks $T_3$-$T_6$ is greater than 100 Ohms. In another embodiment, the impedance is equal to or greater than 120 Ohms. In still another embodiment, the impedance of the tracks $T_3$-$T_6$ is equal to or greater than 150 Ohms. In still a further embodiment, the impedance of the tracks $T_3$-$T_6$ is equal to or greater than 175 Ohms. In a further embodiment, the impedance of the tracks $T_3$-$T_6$ is equal to or greater than 200 Ohms.

The impedance of tracks $T_3$-$T_6$ can also be increased by increasing the lengths of the tracks $T_3$-$T_6$ provided between the springs $CS_3$-$CS_6$ and the insulation displacement connectors $IDC_3$-$IDC_6$. In certain embodiments, this increased length can be provided by using serpentine or loop back routing configurations for the tracks $T_3$-$T_6$. In lengthening the tracks $T_3$-$T_6$ provided between contact springs $CS_3$-$CS_6$ and their corresponding insulation displacement connector blades $IDC_3$-$IDC_6$, in certain embodiments, the tracks $T_3$-$T_6$ can be lengthened to be at least one and a half times or at least two times as long as the straight line distance between the springs $CS_3$-$CS_6$ and their corresponding insulation displacement connector blades $IDC_3$-$IDC_6$. In other embodiments, the tracks $T_3$-$T_6$ can be at least three or four times as long as the straight line distances between the contact springs $CS_3$-$CS_6$ and their corresponding insulation displacement connector blades $IDC_3$-$IDC_6$.

The impedance of the tracks $T_3$-$T_6$ can also be increased by increasing/maximizing the spacing between track $T_4$ and track $T_5$, and between track $T_3$ and track $T_6$. In one embodiment, the tracks $T_4$ and $T_5$ diverge from one another as the tracks $T_4$ and $T_5$ extend away from the contact springs $CS_4$ and $CS_5$, and then converge again as the tracks $T_4$ and $T_5$ approach the insulation displacement connector blades $IDC_4$ and $IDC_5$. Thus, mid regions of the tracks $T_4$ and $T_5$ are spaced relatively far away from one another. In one embodiment, a spacing of at least 0.1 inches, measured in a direction parallel to a width W of the circuit board, is defined between portions of the tracks $T_4$ and $T_5$. In certain embodiments, this spacing represents at least ¼ of the width of the circuit board. It will be appreciated that similar spacings can be used between the track $T_3$ and the track $T_6$ to increase impedance.

Referring still to FIG. 10, return loss can also be improved by providing a capacitive coupling C15 between track $T_3$ and track $T_6$, and a capacitive coupling C16 between track $T_4$ and track $T_5$. For the capacitive coupling C15 and C16 to improve and not worsen return loss, the couplings C15, C16 should be placed far enough away from the center of the three zones of compensation $Z_{A1}$-$Z_{A3}$ so that the phase of the capacitance introduced by the couplings C15 and C16 cancels return loss along the tracks $T_3$-$T_6$ at higher frequencies.

Figure 13:
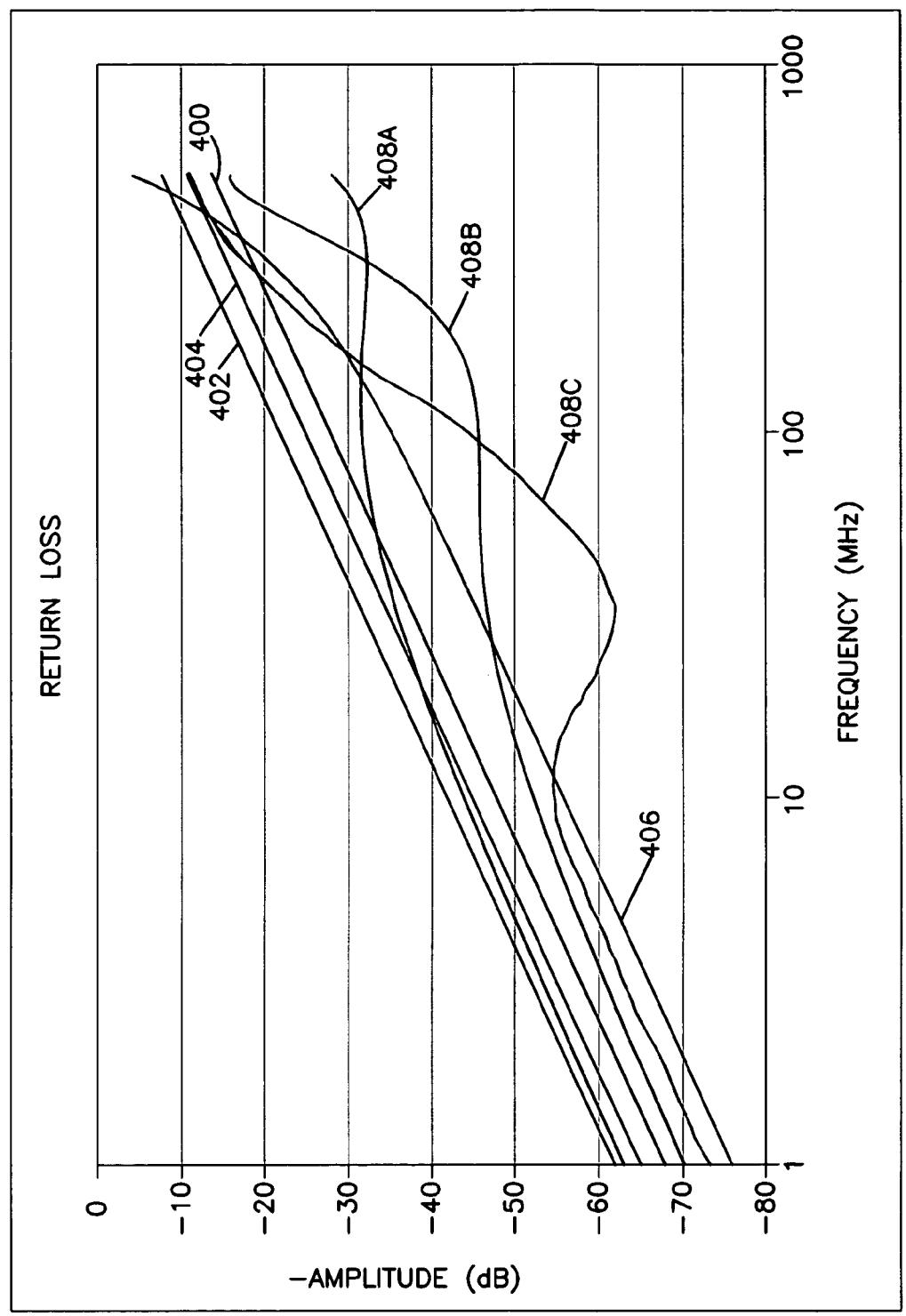
FIG. 13 is a graph that depicts how certain factors can affect return loss in the jack of FIG. 4 across a range of frequencies.

FIG. 13 is a graph that depicts how different factors can affect return loss in the jack across a range of frequencies. In the graph, return loss is plotted on the y axis and frequency is plotted on the x axis. Line 400 represents the maximum permissible return loss across the range of frequencies. Line 402 represents the return loss present in tracks $T_3$-$T_6$ if standard 100 Ohm tracks of standard length are used to provide electrical pathways between the contact springs and the insulation displacement connector blades. Line 404 shows the return loss present in the tracks if the tracks of standard length are converted to high impedance lines. As shown by line 404, the return loss is improved as compared to line 402, but still does not comply with the level of return loss set by line 400. Line 406 shows the return loss in the tracks if the high impedance tracks are extended in length between the contact springs and the insulation displacement connector blades. As shown by line 406, the lengthened, high impedance tracks greatly improve return loss at lower frequencies, but worsen return loss at higher frequencies (e.g., frequencies greater than 300 MHz). Lines 408A, 408B and 408C show the effects of adding capacitive couplings C15, C16 between track $T_3$ and track $T_6$ and between track $T_4$ and track $T_5$ in combination with using relatively long, high impedance tracks between the contact springs $CS_3$-$CS_6$ and the insulation displacement connector blades $IDC_3$-$IDC_6$. To comply with the return loss levels set by line 400, the distance the capacitive couplings are placed from the center of the zones of compensation $Z_{A1}$-$Z_{A3}$ is significant. If the capacitive couplings C15, C16 are too close to the capacitive couplings of the zones of compensation $Z_{A1}$-$Z_{A3}$, the return loss will fail at low frequencies (as shown by line 408A). If the capacitive couplings C15, C16 are positioned too far from the zones of compensation $Z_{A1}$-$Z_{A3}$, return loss failure will occur at higher frequencies as shown by line 408C. By selecting the distance of the capacitive couplings C15, C16 from the zones of compensation $Z_{A1}$-$Z_{A3}$ such that the capacitive couplings C15, C16 effectively cancel return loss for frequencies in the range of 200-500 Mhz, the jack can meet the return loss parameters set by line 400 over the entire frequency range as shown by line 408B.

Figure 14:
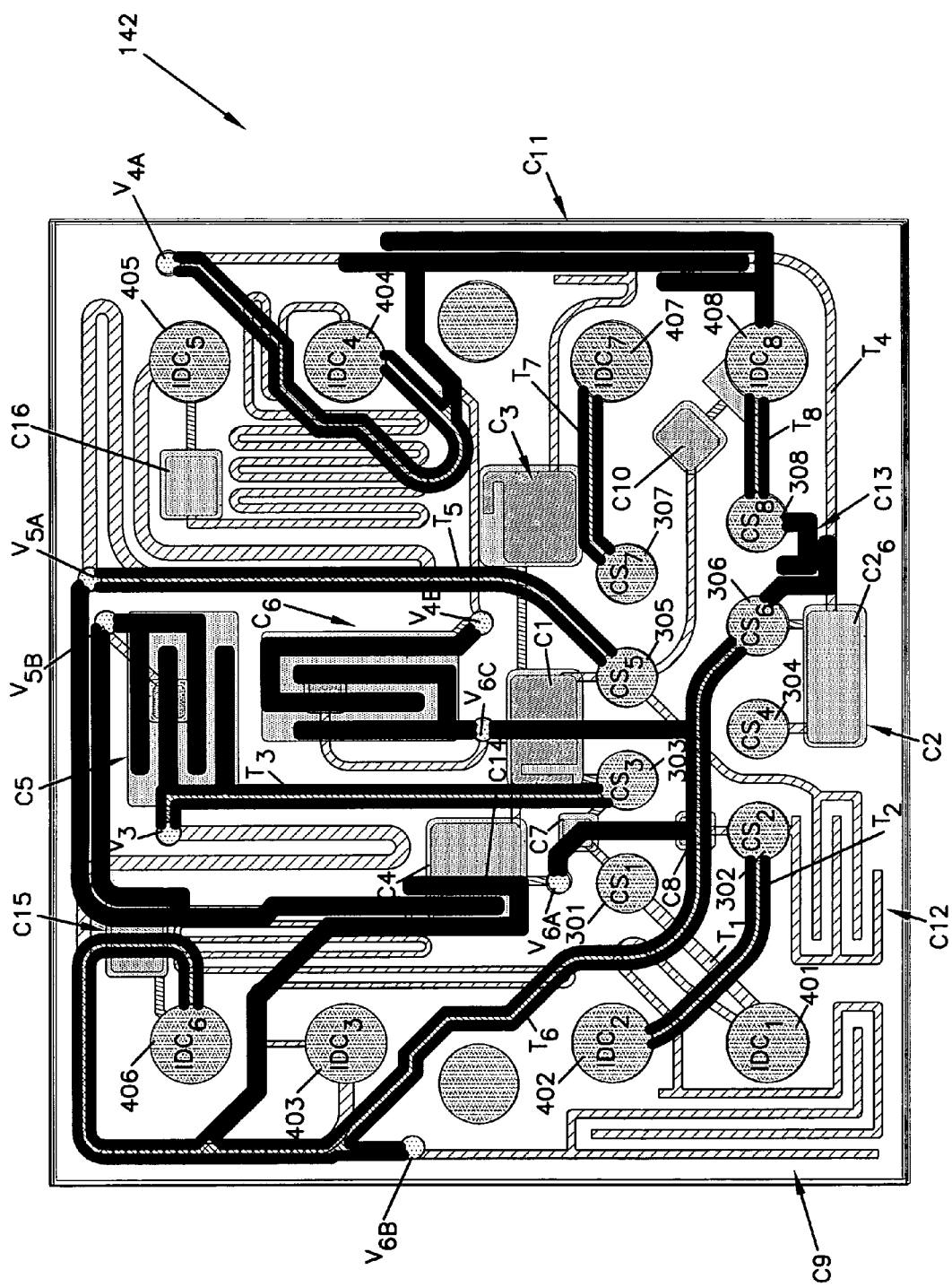
FIG. 14 is a tracing overlay view of the circuit board used in the telecommunications jack of FIG. 4.
Figure 15:
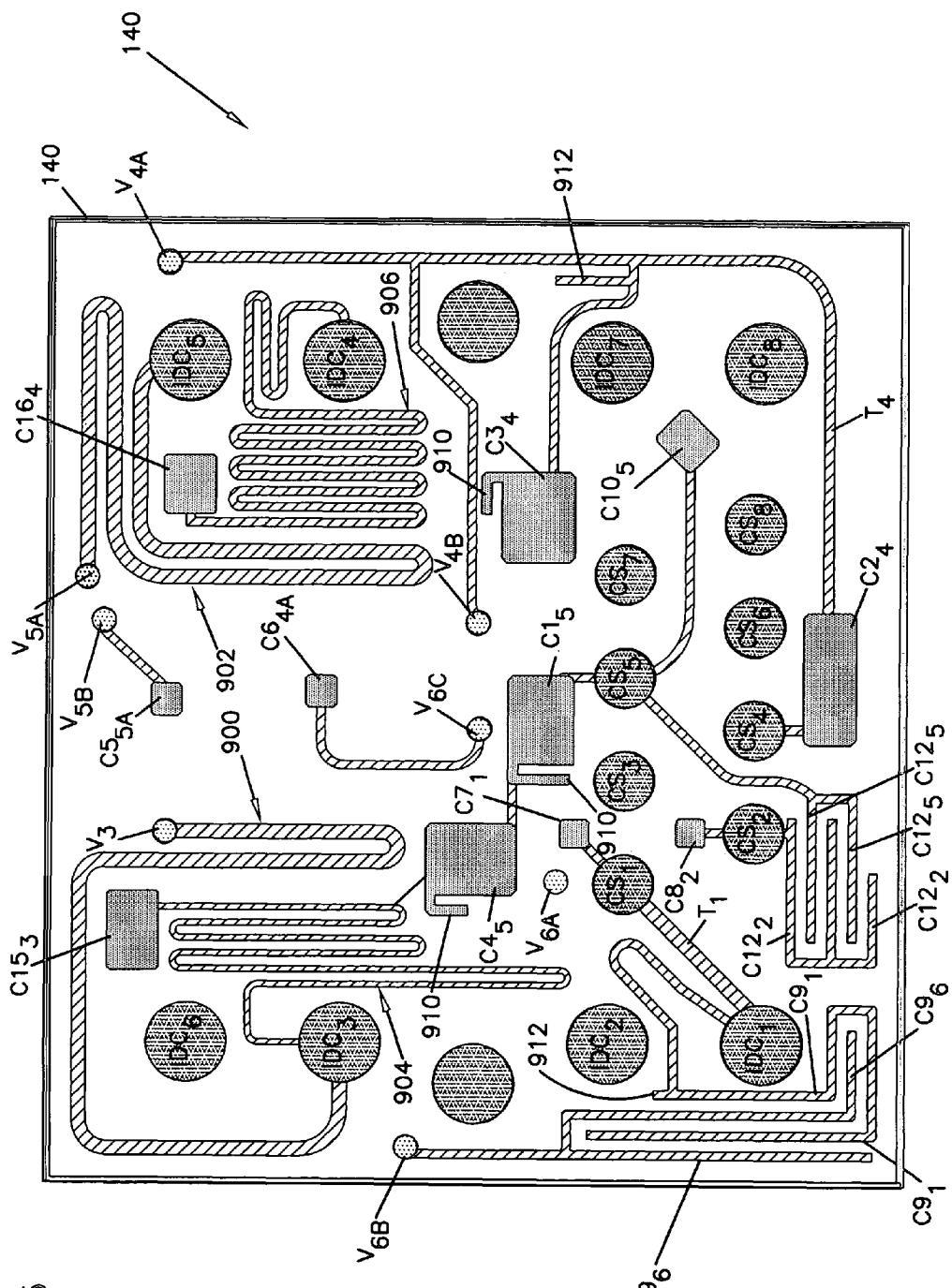
FIG. 15 shows a front conductive layer of the circuit board used in the telecommunications jack of FIG. 4.
Figure 16:
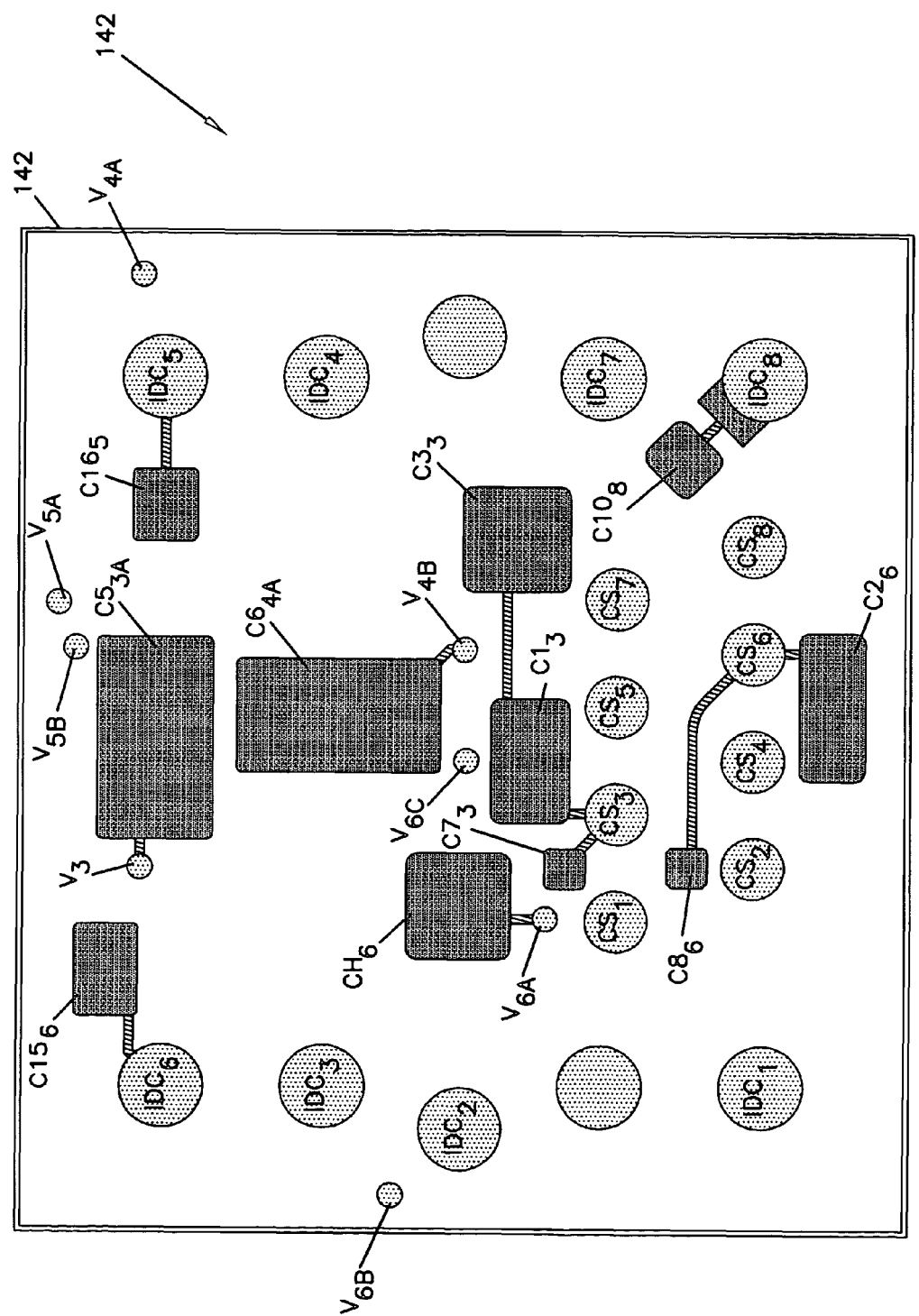
FIG. 16 shows a middle conductive layer of the circuit board used in the telecommunications jack of FIG. 4.
Figure 17:
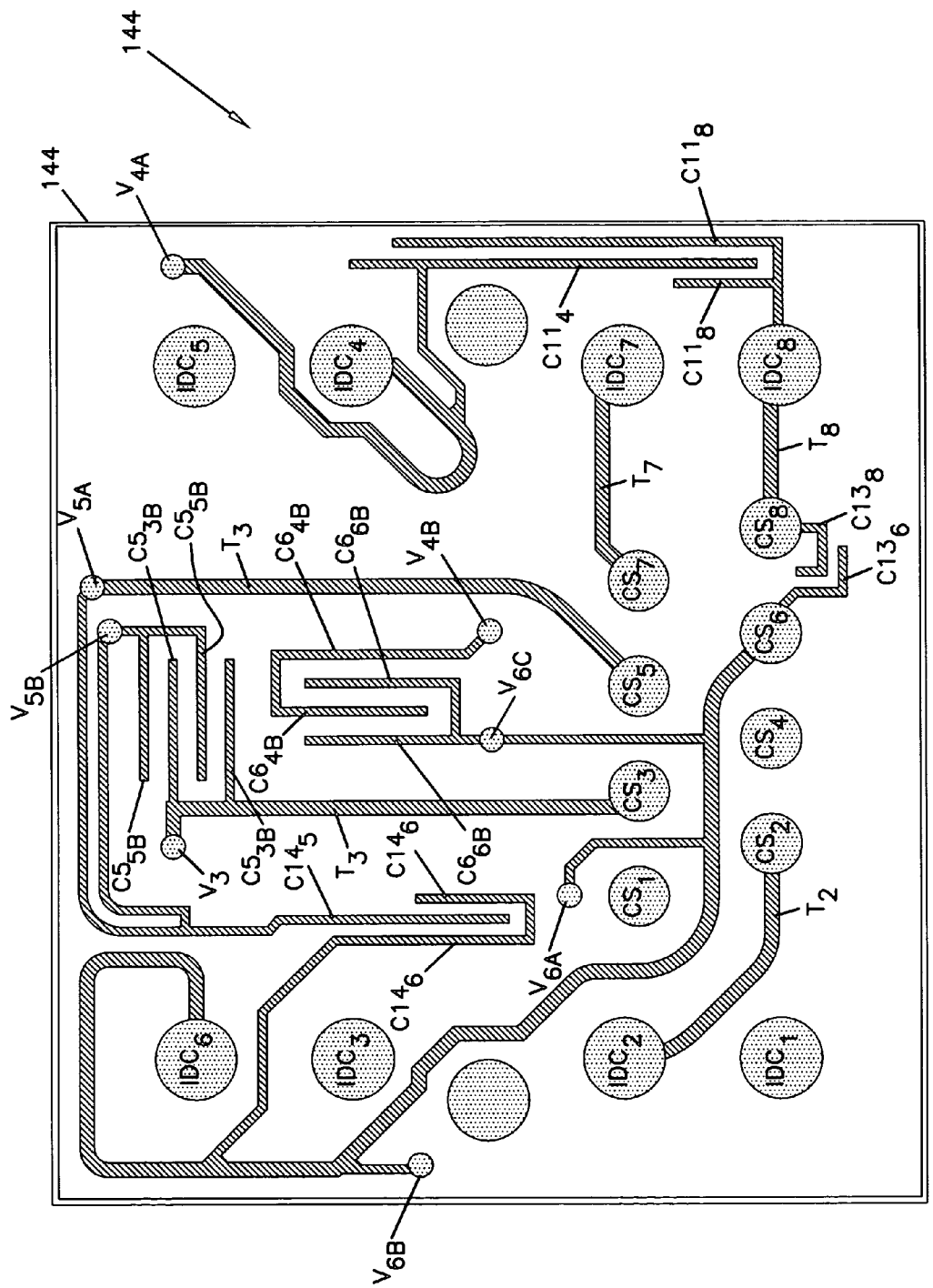
FIG. 17 is shows a back conductive layer of the circuit board used in the telecommunications jack of FIG. 4.

FIGS. 14-17 show an example circuit board layout for implementing the compensation arrangement of FIG. 10. FIGS. 15-17 respectively show the front, middle and back conductive layers 140, 142 and 144 of the circuit board 132. FIG. 14 is an overlay of the three conductive layers 140, 142 and 144. The circuit board 132 defines openings 301-308 that respectively receive posts of the contact springs $CS_1$-$CS_8$ so that the contact springs $CS_1$-$CS_8$ are terminated to the board 132. The circuit board also defines openings 401-408 for respectively receiving posts of the insulation displacement connector blades $IDC_1$-$IDC_8$ such that the insulation displacement connector blades $IDC_1$-$IDC_8$ are terminated to the circuit board. Vias extend through the circuit board for electrically interconnecting the tracks between the layers 140, 142 and 144. For example, vias $V_{6A}$, $V_{6B}$ and $V_{6C}$ interconnect the portions of the track $T_6$ located at the different layers 140, 142 and 144. Also, vias $V_{5A}$ and $V_{5B}$ interconnect the portions of the track $T_5$ located at the different layers 140, 142 and 144. Moreover, vias $V_{4A}$ and $V_{4B}$ interconnect the portions of the track $T_4$ located at the different layers 140, 142 and 144. Additionally, via $V_3$ interconnects the portions of the track $T_3$ located at the different layers 140, 142 and 144. The tracks $T_1$, $T_2$, $T_7$ and $T_8$ are each provided on a single layer of the board 132. For example, tracks $T_1$ and $T_2$ are provided at layer 140 and tracks $T_7$ and $T_8$ are provided at layer 144.

Referring to FIGS. 14-16, the capacitive coupling C1 of the first zone of compensation $Z_{A1}$ is provided by opposing capacitor plates $C1_5$ and $C1_3$ respectively provided at layers 140 and 142. The capacitive coupling C2 of the first zone of compensation $Z_{A1}$ is provided by opposing capacitor plates $C2_4$ and $C2_6$ that are respectively provided at the layers 140 and 142. The capacitive coupling C3 of the second compensation zone $Z_{A2}$ is provided by opposing capacitor plates $C3_4$ and $C3_3$ that are respectively provided at layers 140 and 142. The capacitive coupling C4 of the second compensation zone $Z_{A2}$ is provided by opposing capacitor plates $C4_5$ and $C4_6$ that are respectively provided at layers 140 and 142. The capacitive coupling C5 of the third compensation zone $Z_{A3}$ is provided by opposing capacitor plates $C5_{5A}$ and $C5_{3A}$ that are respectively provided at layers 140 and 142. The capacitive coupling C5 is also provided by inter-digitated capacitor fingers $C5_{5B}$ and $C5_{3B}$ that are provided at layer 144. The capacitive coupling C6 of the second compensation zone $Z_{A3}$ is provided by opposing capacitor plates $C6_{6A}$ and $C6_{4A}$ respectively provided at layers 140 and 142. The capacitive coupling C6 is also provided by inter-digitated capacitor fingers $C6_{6B}$ and $C6_{4B}$ provided at layer 144.

The capacitive coupling C7 of the first compensation zone $Z_{B1}$ is provided by opposing capacitor plates $C7_1$ and $C7_3$ that are respectively provided at layers 140 and 142 of the circuit board. The capacitive coupling C8 of the first compensation zone $Z_{B1}$ is provided by opposing capacitor plates $C8_2$ and $C8_6$ that are respectively provided at the layers 140 and 142 of the circuit board. The capacitive coupling C9 of the second zone of compensation $Z_{B2}$ is provided by inter-digitated capacitor fingers $C9_1$ and $C9_6$ that are provided at layer 140 of the circuit board.

The capacitive coupling C10 of the first compensation zone $Z_{C1}$ is provided by opposing capacitor plates $C10_5$ and $C10_8$ that are respectively provided at layers 140 and 142 of the circuit board. The capacitive coupling C11 of the second compensation zone $Z_{C2}$ is provided by inter-digitated capacitor fingers $C11_4$ and $C11_8$ that are provided at layer 144 of the circuit board.

The capacitive coupling C12 of the zone of compensation $Z_{D1}$ is provided by inter-digitated capacitor fingers $C12_2$ and $C12_5$ provided at layer 140 of the circuit board. The capacitive coupling C13 of the zone of compensation $Z_{E1}$ is provided by parallel capacitor fingers $C13_8$ and $C13_6$ provided at layer 144 of the circuit board. The capacitive coupling C14 is provided by inter-digitated capacitor fingers $C14_5$ and $C14_6$ that are provided at layer 144 of the circuit board. The capacitive coupling C15 is provided by opposing capacitor plates $C15_3$ and $C15_6$ that are respectively provided at layers 140 and 142 of the circuit board. The capacitive couplings C16 is provided by opposing capacitor plates $C16_4$ and $C16_5$ that are respectively provided at layers 140 and 142 of the circuit board.

Referring still to FIGS. 14-17, it is noted that the tracks $T_4$ and $T_5$ are routed away from one another for a majority of their lengths so as to increase the impedance of the tracks to address return loss. Similarly, tracks $T_3$ and $T_6$ are routed away from one another for a majority of their lengths to also increase impedance in the tracks to address return loss. It is also noted that tracks $T_3$-$T_6$ also preferably have extended lengths to increase impedance for improving return loss performance. For example, referring to FIG. 14, track $T_3$ loops up and around as it extends from contact spring $CS_3$ to its corresponding insulation displacement connector blade $IDC_3$. Track $T_3$ also includes a loop back 900 for further increasing the length of the track $T_3$. Still referring to FIG. 14, track $T_4$ loops over, up and around as it extends from contact spring $CS_4$ to its corresponding insulation displacement connector blade $IDC_4$. Referring further to FIG. 14, track $T_5$ loops up and over as it extends from contact spring $CS_5$ to its corresponding insulation displacement connector blades $IDC_5$. Additionally, track $T_5$ has a loop back 902 for further increasing the length of the track. Referring once again to FIG. 14, track $T_6$ extends over up and around as it extends from contact spring $CS_6$ to its corresponding insulation displacement connector blade $IDC_6$.

Referring still to FIG. 14, the routing configuration of the tracks on the circuit board are also adapted for positioning the capacitive couplings C15 and C16 relatively far from the center of the capacitive provided by the three zones of compensation $Z_{A1}$-$Z_{A3}$. For example, to provide this extra distance, loop extension portions 904 and 906 are provided with multiple loop backs for increasing the spacings of the capacitive couplings C15, C16 from the center of the capacitance provided by the zones of compensation $Z_{A1}$-$Z_{A3}$. The circuit board is also provided with structures adapted for promoting manufacturing efficiency. For example, each set of opposing plate capacitors has a first plate that is larger than the corresponding second plate so that portions of the first plate extend outwardly beyond the boundaries of the second plate. This facilitates manufacturing efficiency because the exact registration between the plates is not required. Additionally, some of the plates are provided with stubs 910 that can be laser trimmed to exactly tune the capacitance so that the jack satisfies the relevant crosstalk requirements. The capacitance can also be tuned by using a combination of capacitor plates and parallel capacitor fingers at one zone of compensation. Furthermore, some of the tracks are provided with stubs 912 that can be used during design of the circuit board to manually vary the lengths of the tracks. In this way, the effect of varying certain track lengths can be empirically assessed.

The above specification provides examples of how certain inventive aspects may be put into practice. It will be appreciated that the inventive aspects can be practiced in other ways than those specifically shown and described herein without departing from the spirit and scope of the inventive aspects.

What is claimed is:

1. A telecommunications jack for use in a twisted pair system, the telecommunications jack comprising:
   a housing defining a port for receiving a plug;
   a plurality of contact springs adapted to make electrical contact with the plug when the plug is inserted into the port of the housing;
   a plurality of wire termination contacts for terminating wires to the jack;
   a circuit board including conductive tracks that electrically connect the contact springs to the wire termination contacts; and a crosstalk compensation arrangement that provides crosstalk compensation between selected tracks of the circuit board, the selected tracks including two pairs of tracks, wherein tracks of each pair diverge from one another as the tracks extend from their corresponding contact spring to their corresponding wire termination contacts, the selected tracks also having high impedance portions with impedances greater than 100 ohms;

wherein capacitive couplings are provided between the tracks of each pair at a position located between the crosstalk compensation arrangement and the wire termination contacts, the capacitive couplings being positioned far enough away from the crosstalk compensation arrangement to reduce return loss of the selected tracks at least for signal frequencies in the range of 200-500 MHz.

2. The telecommunications jack of claim 1, wherein the high impedance portions of the selected tracks have impedances greater than 150 ohms.

3. The telecommunications jack of claim 2, wherein the high impedance portions of the selected tracks extend generally from the crosstalk compensation arrangement to the wire termination contacts.

4. The telecommunications jack of claim 2, wherein the selected tracks include two pairs of tracks, and wherein the crosstalk compensation arrangement includes at least three zones of compensation provided between the two pairs of tracks.

5. The telecommunications jack of claim 2, wherein the high impedance portions of the selected tracks have lengths at least 1.5 times as long as straight-line distances between the contact springs and the wire termination contacts.

6. The telecommunications jack of claim 2, wherein the high impedance portions of the selected tracks have lengths at least 2 times as long as straight-line distances between the contact springs and the wire termination contacts.

7. The telecommunications jack of claim 2, wherein the high impedance portions of the selected tracks have lengths at least 3 times as long as straight-line distances between the contact springs and the wire termination contacts.

8. The telecommunications jack of claim 2, wherein the high impedance portions of the selected tracks have loop-back portions located between the crosstalk compensation arrangement and the wire termination contacts for increasing the lengths of the high impedance portions.

9. The telecommunications jack of claim 8, wherein the loop-back portions have a serpentine configuration.

10. The telecommunications jack of claim 2, wherein:
the plurality of contact springs includes first, second, third, fourth, fifth, sixth, seventh and eighth consecutively arranged contact springs adapted to make electrical contact with the plug when the plug is inserted into the port of the housing;
the plurality of wire termination contacts includes first, second, third, fourth, fifth, sixth, seventh and eighth wire termination contacts for terminating wires to the jack;
the circuit board includes first, second, third, fourth, fifth, sixth, seventh and eighth tracks that respectively electrically connect the first, second, third, fourth, fifth, sixth, seventh and eighth contact springs to the first, second, third, fourth, fifth, sixth, seventh and eighth wire termination contacts;
a first compensation zone is provided including first and second capacitive couplings, the first capacitive coupling being made between the third and fifth tracks and the second capacitive coupling being made between the fourth and sixth tracks;

a second compensation zone is provided including third and fourth capacitive couplings, the third capacitive coupling being made between the third and fourth tracks and the fourth capacitive coupling being made between the fifth and sixth tracks;
a third compensation zone is provided including fifth and sixth capacitive couplings, the fifth capacitive coupling being made between the third and fifth tracks, and the sixth capacitive coupling being made between the fourth and sixth tracks; and
the selected tracks include the third, fourth, fifth and sixth tracks.

11. The telecommunications jack of claim 10, wherein the high impedance portions of the selected tracks have lengths at least 1.5 times as long as straight-line distances between the contact springs and the wire termination contacts.

12. The telecommunications jack of claim 10, wherein the high impedance portions of the selected tracks have loop-back portions located between the crosstalk compensation arrangement and the wire termination contacts for increasing the lengths of the high impedance portions.

13. The telecommunications jack of claim 10, wherein capacitive couplings are provided between the fourth and fifth tracks and between the third and sixth tracks at positions located between the crosstalk compensation arrangement and the wire termination contacts, the capacitive couplings being positioned to reduce the return loss of the selected tracks at least for signal frequencies in the range of 200-500 MHz.

14. The telecommunications jack of claim 1, wherein the high impedance portions of the selected tracks have impedances greater than 175 ohms.

15. A telecommunications jack for use in a twisted pair system, the telecommunications jack comprising:
a housing defining a port for receiving a plug;
a plurality of contact springs adapted to make electrical contact with the plug when the plug is inserted into the port of the housing;
a plurality of wire termination contacts for terminating wires to the jack;
a circuit board including conductive tracks that electrically connect the contact springs to the wire termination contacts, the conductive tracks including first and second pairs of tracks adapted for carrying twisted pair signals, the first pair of tracks including first and second tracks, and the second pair of tracks including third and fourth tracks;
a crosstalk compensation arrangement that provides crosstalk compensation between the first pair of tracks and the second pair of tracks; and
capacitive couplings for reducing the return loss of the first and second pairs of tracks, the capacitive couplings including a first capacitive coupling between the first and second tracks and a second capacitive coupling between the third and fourth tracks, the first and second capacitive couplings being positioned far enough away from the crosstalk compensation arrangement to reduce the return loss of the first and second pairs of tracks at least for signal frequencies in the range of 200-500 MHz.

16. The telecommunications jack of claim 15, wherein the plurality of contact springs includes eight contact springs consecutively arranged in positions one, two, three, four, five, six, seven and eight, wherein the first pair of tracks correspond the contact springs located at positions four and five, and the second pair of tracks correspond to the contact springs located at positions three and six.

17. The telecommunications jack of claim 15, wherein the first capacitive coupling is formed between first and second spaced-apart capacitor plates, and the second capacitive coupling is formed between third and fourth spaced-apart capacitor plates.

18. A method for compensating for crosstalk and return loss in a conductive pair adapted for carrying a twisted pair signal, the conductive pair including first and second conductive tracks, the method comprising:

applying crosstalk compensating capacitances to the first and second conductive tracks at one or more zones of compensation to reduce crosstalk; and applying a return loss compensating capacitance between the first and second tracks at a position far enough away from the crosstalk compensation arrangement to reduce return loss.

\* \* \* \* \*